United States Patent
Chen (10) Patent No.: US 9,816,682 B2
(45) Date of Patent: Nov. 14, 2017

(54) OPTICS FOR CHIP-ON-BOARD LIGHTING HAVING A PROTRUSION

(71) Applicant: BRIDGELUX, INC., Livermore, CA (US)

(72) Inventor: Xiaolu Chen, Livermore, CA (US)

(73) Assignee: BRIDGELUX INC., Fremont, CA (US)

( * ) Notice: Subject to any disclaimer, the term of this patent is extended or adjusted under 35 U.S.C. 154(b) by 94 days.

(21) Appl. No.: 14/243,695

(22) Filed: Apr. 2, 2014

(65) Prior Publication Data
US 2015/0285461 A1    Oct. 8, 2015

(51) Int. Cl.
*H01L 27/15* (2006.01)
*H01L 29/267* (2006.01)
(Continued)

(52) U.S. Cl.
CPC .............. *F21V 7/0091* (2013.01); *F21V 5/04* (2013.01); *F21V 5/08* (2013.01); *G02B 19/0028* (2013.01);
(Continued)

(58) Field of Classification Search
CPC ......... H01L 33/20; H01L 33/32; H01L 33/38; H01L 33/44; H01L 33/486; H01L 33/54; H01L 33/60; H01L 33/62; H01L 2224/16; H01L 2224/48091; H01L 2924/01078; H01L 2924/01079; H01L 2924/16152; H01L 2924/16195; H01L 31/0203; H01L 31/0232; H01L 31/0236; H01L 27/14618; H01L 27/14625; H01L 27/14627;
(Continued)

(56) References Cited

U.S. PATENT DOCUMENTS 1,412,411 A  *  4/1922  McInroy ................. B60Q 11/00
                                                    362/341
1,531,820 A  *  3/1925  Schultz ................... F21S 48/145
                                                    362/341
(Continued)

FOREIGN PATENT DOCUMENTS

CN  WO 2011124004 A1  *  10/2011  ................ F21V 7/16
EP        1431653 A       6/2004
(Continued)

OTHER PUBLICATIONS

Bortz JC et al.: "Optimal Design of a Nonimaging Projection Lens for Use with an LED Source and a Rectangular Target," Novel Optical Systems Design and Optimization III Jul. 31-Aug. 1, 2000—San Diego, CA, vol. 1 4092, Oct. 2, 2000, pp. 130-38, XP002525125, Proceedings of the SPIE—The International Society for Optical Engineering SPIE—Int. Soc. Opt. Eng USA ISSN: 0277-786X.
(Continued)

*Primary Examiner* — Teresa M Arroyo
(74) *Attorney, Agent, or Firm* — Arent Fox LLP (57) ABSTRACT

A cover for a light source for use in a lamp or luminaire. An outer surface of the cover, opposite the light source, comprises a rounded shape and includes a protrusion extending from the cover. The protrusion extends substantially in a light emission direction and is shaped the protrusion to direct light emitted from the light source in a desired direction.

20 Claims, 9 Drawing Sheets

(51) Int. Cl.
*H01L 31/12* (2006.01)
*H01L 33/00* (2010.01)
*H01L 31/0203* (2014.01)
*H01L 31/0232* (2014.01)
*H01L 23/12* (2006.01)
*F21V 7/00* (2006.01)
*F21V 5/04* (2006.01)
*F21V 5/08* (2006.01)
*G02B 19/00* (2006.01)
*F21S 8/08* (2006.01)
*F21W 131/103* (2006.01)
*H01L 27/146* (2006.01)
*F21V 7/09* (2006.01)
*H01L 33/20* (2010.01)
*H01L 33/48* (2010.01)
*H01L 33/44* (2010.01)
*H01L 33/60* (2010.01)
*H01L 33/54* (2010.01)
*H01L 33/38* (2010.01)
*H01L 31/0236* (2006.01)

(52) U.S. Cl.
CPC ........... *G02B 19/0061* (2013.01); *F21S 8/086* (2013.01); *F21V 7/09* (2013.01); *F21W 2131/103* (2013.01); *H01L 27/14618* (2013.01); *H01L 27/14625* (2013.01); *H01L 27/14627* (2013.01); *H01L 31/0203* (2013.01); *H01L 31/0232* (2013.01); *H01L 31/0236* (2013.01); *H01L 33/20* (2013.01); *H01L 33/38* (2013.01); *H01L 33/44* (2013.01); *H01L 33/486* (2013.01); *H01L 33/54* (2013.01); *H01L 33/60* (2013.01); *H01L 2924/16152* (2013.01)

(58) Field of Classification Search
CPC .......... H01L 23/10; Y02E 10/50; F21S 8/086; F21V 7/0091; F21V 7/09; F21V 7/10; F21V 5/04; F21V 5/08; F21W 2131/103; G06F 17/30265; G06F 17/30699; G06F 17/30867; G02B 19/0028; G02B 19/0061
USPC ...... 257/81, 98, 99, 433, 436, 704; 362/235, 362/304, 341–350; 704/9; 706/52, 54
See application file for complete search history.

(56) References Cited

U.S. PATENT DOCUMENTS

| | | | | |
|---|---|---|---|---|
| 1,656,466 | A * | 1/1928 | Barnes | F21S 48/10 362/341 |
| 2,578,451 | A * | 12/1951 | Rex | F21S 8/086 362/297 |
| 2,758,199 | A * | 8/1956 | Yonkers | F21S 8/086 362/341 |
| 6,273,596 | B1 * | 8/2001 | Parkyn, Jr. | F21V 5/048 362/292 |
| 6,286,979 | B1 * | 9/2001 | Ramer | F21S 8/04 362/297 |
| 6,502,956 | B1 | 1/2003 | Wu | |
| 6,784,357 | B1 | 8/2004 | Wang | |
| 7,422,350 | B2 * | 9/2008 | Haddad | F21S 8/086 362/362 |
| 2003/0099115 | A1 | 5/2003 | Reill | |
| 2003/0218880 | A1 * | 11/2003 | Brukilacchio | A61N 5/062 362/293 |
| 2007/0201225 | A1 * | 8/2007 | Holder | F21K 9/00 362/227 |
| 2013/0188353 | A1 * | 7/2013 | Nankil | F21V 21/14 362/235 |
| 2013/0194807 | A1 * | 8/2013 | Li | F21V 7/16 362/278 |
| 2014/0049961 | A1 * | 2/2014 | Wilcox | F21V 29/2293 362/244 |
| 2014/0078757 | A1 * | 3/2014 | Chen | H01L 33/62 362/382 |

FOREIGN PATENT DOCUMENTS

| | | |
|---|---|---|
| WO | 9624802 A | 8/1996 |
| WO | 2005093316 A | 10/2005 |

OTHER PUBLICATIONS

European Patent Application No. EP11006189, filed Feb. 26, 2007, including International Search Report dated Sep. 2, 2011 (EP2383560A1).

* cited by examiner

OPTICS FOR CHIP-ON-BOARD LIGHTING HAVING A PROTRUSION

FIELD

The present application relates generally to light emitting diode (LED)-based illumination, and more particularly, to street and area lighting using chip-on-board (COB) LED lighting sources.

BACKGROUND

Street lighting luminaires generate light patterns that may be evaluated in a classification system known as BUG, for Backlight, Uplight and Glare. BUG is a reference tool, and other metrics may exist to characterized street light performance with respect to an angular altitude direction from vertical down, where upward pointing light has a direction angle from 90° up to 180°, and whether light is directed toward an intended area of illumination or outside at altitude angles from 0° to 90°, as well as azimuth direction in a horizontal plane.

Glare may be generally termed as downward directed light pointing in the intended illumination direction but which may also produce annoying or visually disabling levels of light. Backlight creates generally downward pointing light trespassing onto adjacent sites that may be illuminated by other luminaires, or is altogether undesirable illumination. To a certain extent, Backlight is wasteful and/or undesirable. Uplight is undesirable artificial skyglow, which may adversely affect astronomy with backscattered light pollution, and is mostly wasted energy. Control of the beam pattern and intensity produced by a luminaire may depend at least on the type of light source selected, focusing and redirection of emitted light, including, but not limited to, the use of reflectors, optical correction (e.g., lenses), and shielding (e.g., chimney- or tunnel-type restrictors).

One type of light source is a light emitting diode (LED), which may typically produce satisfactory levels of light intensity at power levels lower than may be needed for incandescent, vapor glow or other light sources. A light emitting diode comprises a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to as an n-type or p-type semiconductor region, respectively.

In LED applications, an LED semiconductor chip includes an n-type semiconductor region and a p-type semiconductor region. A reverse electric field is created at the junction between the two regions, which causes the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light. The ability of LED semiconductors to emit light has allowed these semiconductors to be used in a variety of lighting devices. For example, LED semiconductors may be used in general lighting devices for interior applications or in various exterior applications.

During manufacture, an array comprising a large number of LED semiconductor devices (or dies) are produced on a substrate. Chip-on-board (COB) lights include multiple LED chips packaged together as one lighting module forming a large effective emitting surface, giving the appearance of an "extended" light source. In comparison to a single die (i.e., single chip) LED, which approximates a point source, it is more difficult to design optical lenses for use with large COB LEDs to control the illumination light pattern projected for street lighting to avoid undesirable glare, backlight and uplight. It may be generally desirable to limit glare, for example, beyond 60°-70°, and somewhat similarly for backlight, so as to avoid undesirable illumination, such as may be directed toward residential windows Accordingly, what is needed is a lens design for COB LEDs that form highly efficient optical beam patterns for various applications including street lighting that limit light pollution.

SUMMARY

In an aspect of the disclosure, a lamp includes a light source, and an optical element having an index of refraction greater than 1, wherein the optical element includes an inner surface arranged opposite the light source, and an outer surface of varying curvature originating from a single point above the light source to an edge of the optical element, wherein a portion of the outer surface at a peripheral edge of the optical element is configured to redirect light emitted from the light source by total internal reflection.

In an aspect of the disclosure, a luminaire optical assembly emitting light in a confined beam pattern includes a light source, a lens having an index of refraction greater than 1 comprising an inner surface arranged to face the light source, an outer surface of varying curvature originating from a single point above the light source to an edge of the optical element, wherein a portion of the outer surface at a peripheral edge of the optical element is configured to redirect light emitted by the light source by total internal reflection into a confined beam pattern.

In an aspect of the disclosure, a cover for use in a lamp or luminaire covers a light source. An outer surface of the cover, opposite the light source, comprises a rounded shape and includes a protrusion extending from the cover. The protrusion extends substantially in a light emission direction and is shaped the protrusion to direct light emitted from the light source in a desired direction.

DESCRIPTION

In various aspects, a lens is provided for desirably controlling a light distribution pattern of light emitted by a COB LED. The resulting light pattern has clear boundaries, where light intensity decreases quickly beyond the intended area of illumination.

The present invention is described more fully hereinafter with reference to the accompanying Drawings, in which various aspects of the present invention are shown. This invention may, however, be embodied in many different forms and should not be construed as limited to the various aspects presented throughout this disclosure. Rather, these aspects are provided so that this disclosure will be complete enough to provide a thorough understanding of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e. g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes may not be intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the Drawings. By way of example, if an apparatus in the Drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 1:
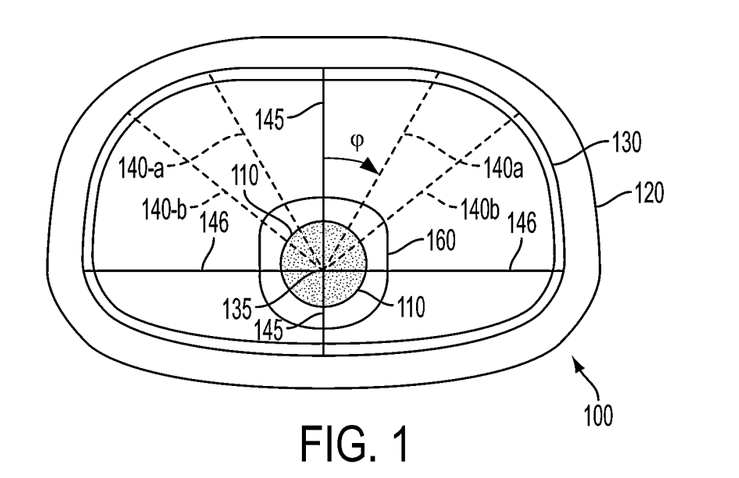
FIG. 1 is a plan view illustrating a COB LED arranged within a complex lens in accordance with the disclosure.

FIG. 1 shows a plan view of an example arrangement of a complex lens 100 arranged with an extended planar light sourced, which may be, for example, a COB LED 110. The complex lens 100 includes a flange 120 surrounding the COB LED 110 that may be used for fixing the complex lens 100 to the COB LED 110. The complex lens 100 may be characterized by an outer surface 130 and an inner surface 160. The inner surface 160 of the complex lens 100 may be arranged over the COB LED 110, and may further be symmetrically arranged with respect to the COB LED 110. The curvature of the inner surface 160 may be, for example, bi-axially elliptical and symmetrically positioned over the COB LED 110, however, other curvatures and asymmetry may be considered within the scope of the disclosure.

The outer surface 130 of the complex lens 100 may be characterized by an indented cusp 135 at a single point. The cusp 135 may preferably be located directly over the COB LED 110 and the inner surface 160 in a symmetrical configuration, however, other placements of the cusp 135 may be considered within the scope of the disclosure. The cusp 135 may serve as an origin from which a plurality of loci 140$_x$ (x=−a, −b, . . . a, b, . . . , etc., where x denotes a value of azimuth angle ϕ) define a surface curvature of the outer surface and diverge toward the flange 120. When viewed as shown in FIG. 1, the loci 140x may change, e.g., continuously, as a function of an azimuth angle ϕ. As shown in FIG. 1, a widthwise plane normal to a plane formed by the flange 120 and indicated by a line 145. The azimuth angle ϕ may be specified with respect to this line, where the single point 135 serves as an origin. Several loci 140$_a$, 140$_b$, . . . 140$_x$, 140$_{-a}$, 140$_{-b}$, . . . 140$_{-x}$, etc., are shown for illustrative purposes in the plan view of FIG. 1, where a, b, . . . x indicate a value of the azimuth angle ϕ.

In one example, the loci may generate a surface of curvature of the outer surface 130 that is mirror symmetric about the widthwise normal plane indicated by line 145, which includes the zero of azimuth, i.e., angle ϕ=0°. That is, loci 140$_x$ and loci 140$_{-x}$ may be symmetrically mirrored across the widthwise normal plane indicated by a line 145 arranged in a widthwise.

In an example where the COB LED 110 is placed centered and symmetric with respect to the cusp 135, the inner surface 160 is shape symmetric (e.g., biaxially elliptic and also placed centered with respect to the cusp 135), it may be clear that the loci 140$_x$ form a surface of curvature of the outer surface 130 that is symmetric about the line 145. Furthermore, it may be clear from this arrangement that light emitted by the light source will be emitted from the complex lens 100 through the outer surface 130 that is also symmetric with respect to the line 145.

For a line 146 defined by ϕ=±90°, where a plane normal to the flange 120 is formed through the line 146, it may be seen that the complex lens 100 has an outer curvature that is asymmetric with respect to the line 146 arranged in a lengthwise direction. As a consequence, it may be seen that light emitted from the COB LED 110 centered with respect to the cusp 135 forms an asymmetric beam with respect to the line 146.

Figure 2:
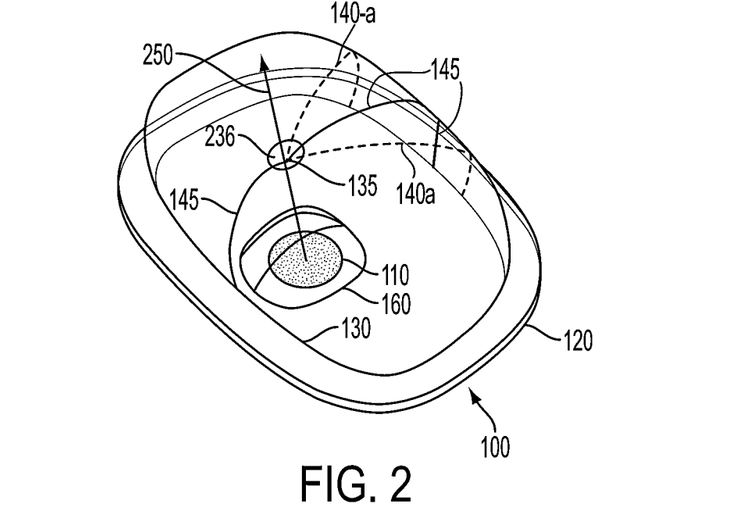
FIG. 2 is a perspective view illustrating the COB LED arranged within the complex lens of FIG. 1 in accordance with the disclosure.

FIG. 2 shows a perspective view of the complex lens 100 and COB LED 110 showing the various features of the inner surface 160, outer surface 130, lines 145 and 146, and example loci of curvatures 140$_a$, 140$_b$, 140$_{-a}$, 140$_{-b}$, of the outer surface 130. The overall light distribution of the light beam pattern produced is mainly controlled by the surface curvature that forms the outer surface 130, the geometry of the inner surface 260 of the complex lens 100, a refractive index of the material included in the complex lens 100, and the geometry and emittance pattern of the COB LED 110. In an example, the cusp 135, from which all loci 140 originate, may be, for example, an indentation with an approximately conical surface region 236. Because it may occur that the brightest illumination from the COB LED 110 may be directed toward the single point 135 substantially along a vector direction 250 normal to a plane containing the COB LED 110 and flange 120, the indentation provides a somewhat conical surface that may enable sufficient refraction and/or total internal reflection of light away from the normal direction to maintain the emitted light intensity across the beam within a certain range at, e.g., street level, i.e., to reduce "hot spots."

The complex lens 100 may be characterized as transparent and having an optical index of refraction n that is typically greater than air, i.e., n>1. A typical optical index of refraction may be ~1.5, but an actual value depends on the material from which the complex lens 100 is made. The index of refraction n and the shape and extent of the conical region 236 determines the redirection of a portion of light emitted from the COB 110 LED in the approximately normal direction away from the normal vector direction 250.

Figure 3:
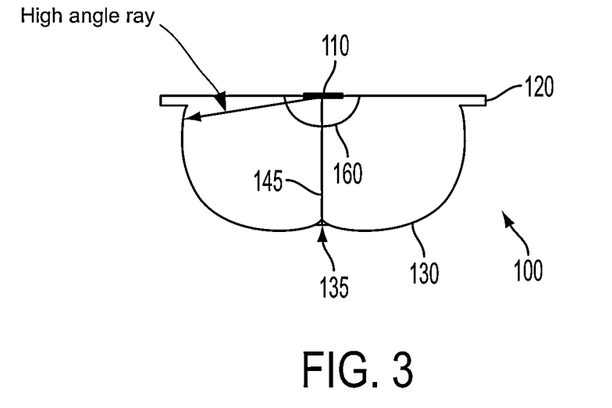
FIG. 3 is a side-view illustrating a long dimension of the complex lens arranged with the COB LED of FIG. 1 in accordance with the disclosure.

FIG. 3 shows a side-view cross-section of the complex lens 100 and COB LED 110 cut through the plane formed by the line 146 of FIG. 1. For the sake of illustration, the arrangement of the COB LED 110 and complex lens 100 are shown pointing so that light is emitted substantially downward, as would be the case in a street light luminaire. It may be seen that the cross-section of the arrangement of the complex lens 100 and COB LED 110 is symmetric with respect to line 145. As a consequence, the projected light emission pattern is also substantially symmetric about line 145. As shown in FIG. 3, light rays emitted at a high angle are strongly directed toward portions of the complex lens 100 adjacent to the flange 120. Light emitted in this direction, if emitted through the outer surface 130 at such locations, may contribute undesirably to Glare, Backlight, or potentially even Uplight. For this reason, the curvature of the outer surface 130 at such locations may be inwardly curved sufficiently to cause total internal reflection (TIR), according to Snell's Law, with the consequence of redirection of light incident at that surface in a direction that is more normal (i.e., downward, in the illustration of FIG. 3), thereby reducing an amount of light that may radiate sideways, in order to reduce Glare and Backlight.

Figure 4:
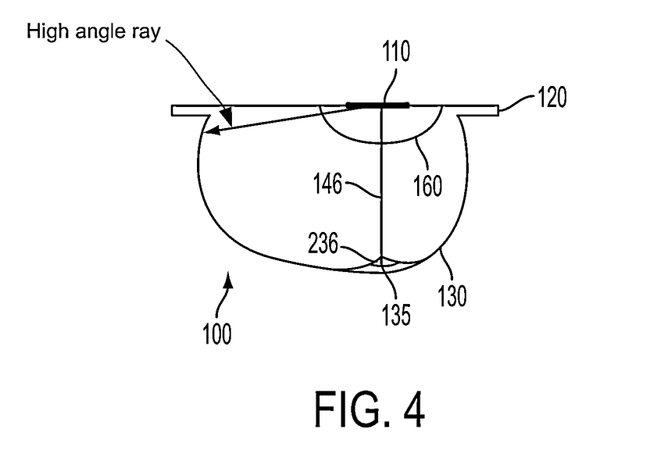
FIG. 4 is a side-view illustrating a view of in a width direction perpendicular to the long direction of the complex lens arranged with the COB LED of FIG. 1 in accordance with the disclosure.

FIG. 4 shows a cross-section side-view illustrating the complex lens 100 and COB LED 110 cut through the plane formed by the line 145 of FIG. 1, and oriented to illuminate in a downward direction, as in FIG. 3. It may be seen that the cross-section of the arrangement of the complex lens 100 and COB LED 110 is asymmetric with respect to line 146. As a consequence, the projected light emission pattern is also substantially asymmetric about line 146. As in the view shown in FIG. 3, light rays emitted at a high angle (not shown) are strongly directed toward portions of the complex lens 100 adjacent to the flange 120, where again, the curvature of the outer surface is inwardly curved sufficiently to cause total internal reflection (TIR), with the consequence again of redirection of light incident at that surface in a direction that is more normal to the plane of the flange 120 and COB LED 110.

Referring to FIG. 3, in operation, high angle rays emitted by the COB LED 110 will be refracted by the inner surface 160 (toward the normal direction of the inner surface 160, according to Snell's Law). The high angle rays intersect a portion of the outer surface 130 (e.g., adjacent or near the flange 120) at an angle beyond the critical angle for total internal reflection (TIR) and consequently are totally internally reflected toward other areas of the outer surface 230 where the angle of incidence is closer to normal, resulting in a portion of the light ray being emitted through the outer surface in a direction that is more usefully concentrated to the street and/or sidewalk. A beam shape of the emitted light, and the sharpness of the boundary between the bright region of the beam, and a darker surrounding space outside the beam is determined by the detailed combination of the various loci of curvatures of the inner surface 160, the outer curved surface 230, particularly nearer the flange 120, and the relative optical index n between (1) the complex lens 100 and the space inside the inner surface 260 (e.g., where presumably $n_{air}$~1) and (2) the region outside the outer curved surface 230 (again, e.g., presumably $n_{air}$~1).

Figure 5A:
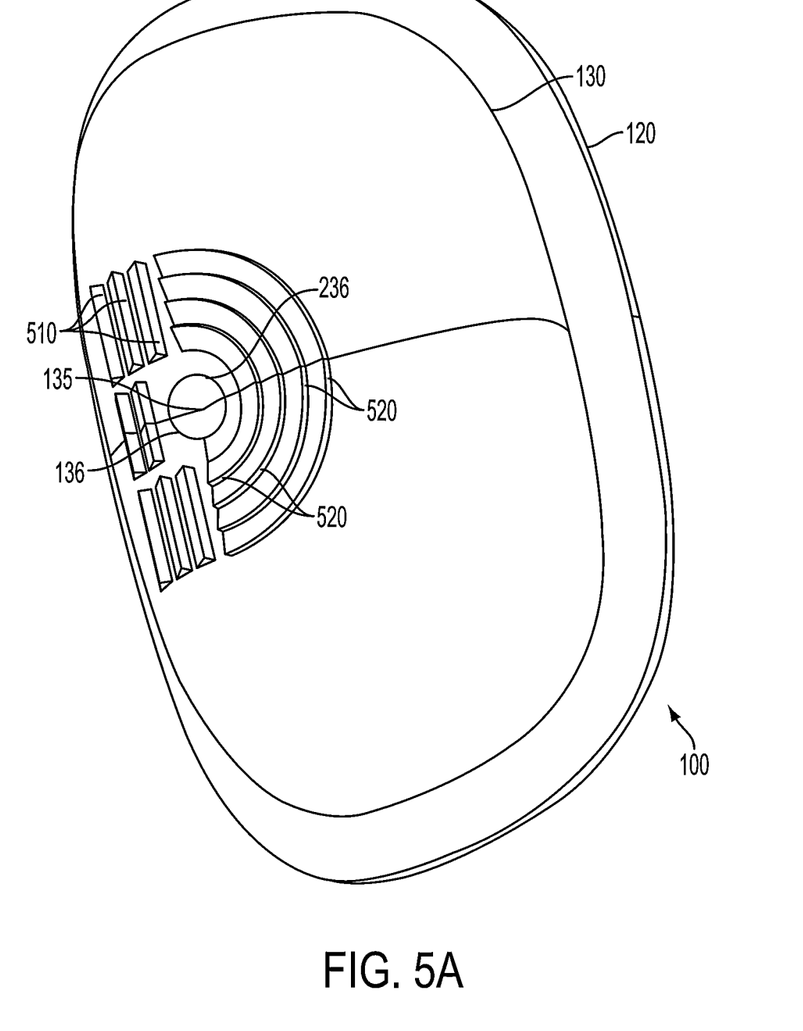
FIG. 5A is a perspective view of one example of the complex lens of FIG. 1 with added features for redirecting light emitted by the COB LED in accordance with the disclosure.

FIG. 5A shows a perspective view of another example of the complex lens 100. The angular distribution of the output rays coming out from the outer surface 130 of the complex lens 100 may be further modified or redistributed by means of additional features 510, 520 integrated with or added to the lens surfaces. The features 510, 520 may be reflective, diffractive, refractive scattering features and any combination thereof. The complex lens 100, and additional features 510, 520 may be any of clear (i.e., optically transparent), semi-transparent, translucent, color tinted. Additionally, the complex lens may have a combination of phosphors on either or both inner and outer surfaces 160, 130 to alter a color balance of light emitted by the COB LED 110.

Figure 5B:
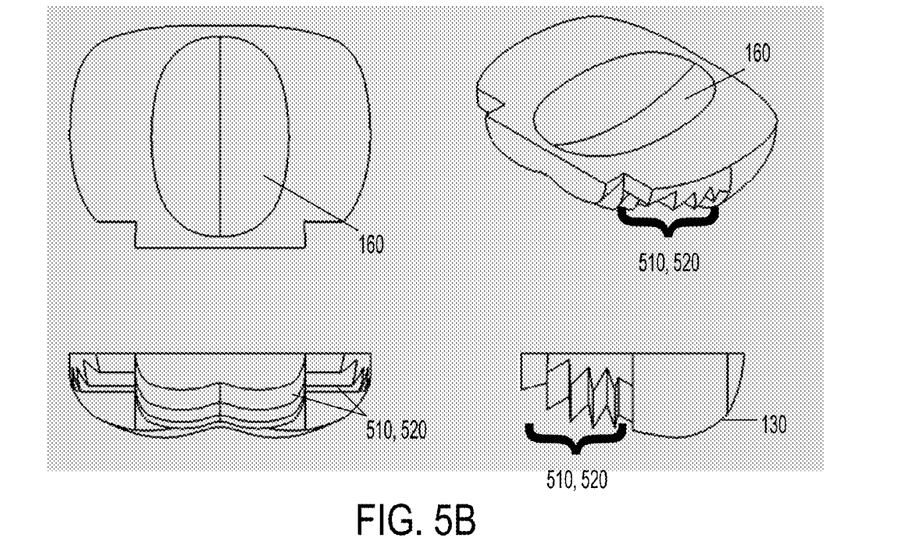
FIG. 5B is a perspective view of a second example of a complex lens with added features for redirecting light emitted by the COB LED in accordance with the disclosure.

FIG. 5B shows several views of another example of the complex lens 100 wherein in the features 510, 520 may include designed indentations in the outer surface 130 rather than being added outside the outer surface 130. Additionally, using an example of this nature, the curvature of the outer surface 130 at the intersection with the flange 120 may not necessarily include undercuts to induce total internal reflection at this periphery, although such undercutting may be retained. An advantage of eliminating the indentation of the curvature of the outer surface 130 at the flange 120 is an easier molding and mold removal operation that does not have to deal with undercuts in the complex lens 100.

Figure 5C:
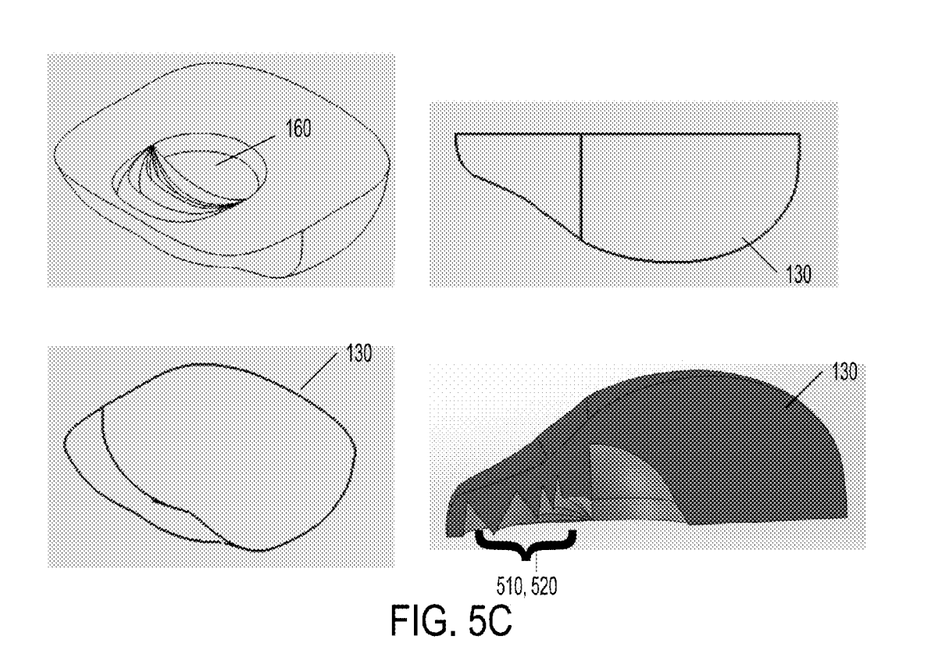
FIG. 5C is a perspective view of a third example of a complex lens with added features for redirecting light emitted by the COB LED in accordance with the disclosure.

FIG. 5C shows several views of still another example of the complex lens 100 wherein in the features 510, 520 may include designed indentations in the inner surface 160 rather than being added to the outer surface 130. In this example the outer surface 130 is smooth, Furthermore, the outer surface 130 may be formed with or without the undercutting, as in the example in FIG. 5B.

Figure 6:
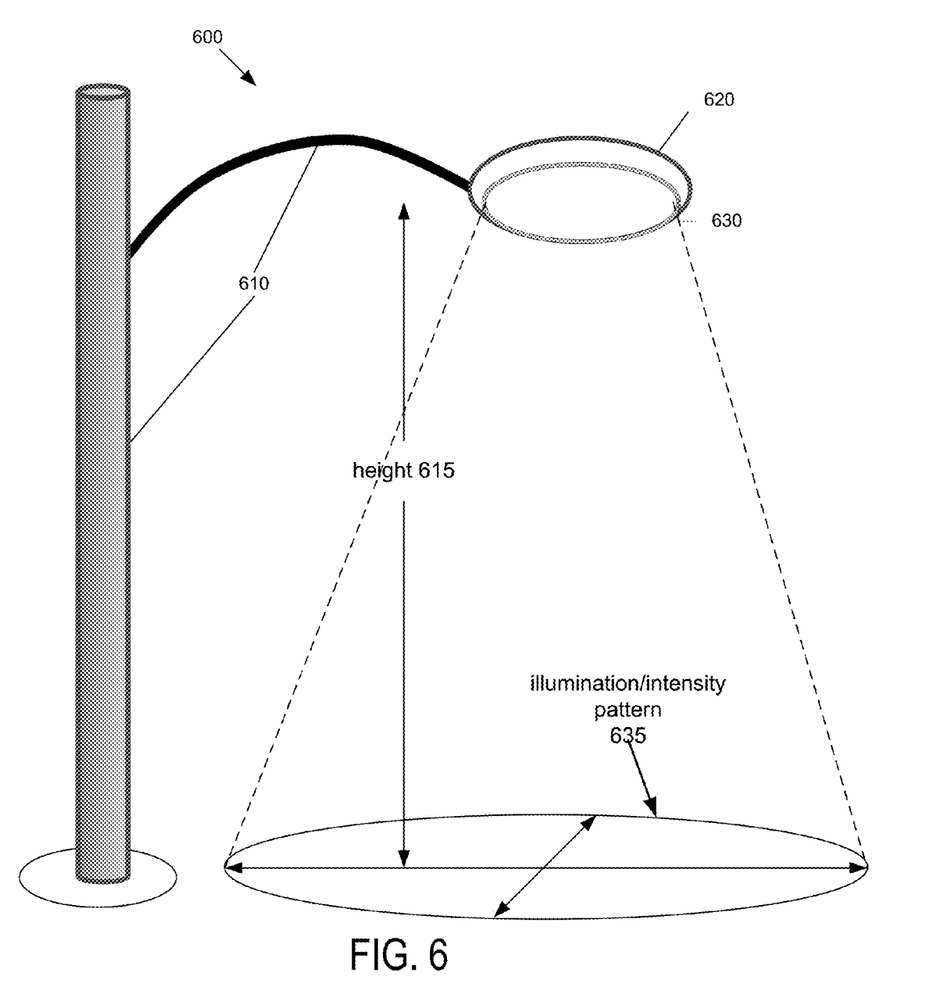
FIG. 6 is a representation of an application of a street lamp as an example of a luminaire optical assembly 600 that may include a COB LED and complex optic in accordance with the disclosure.

FIG. 6 is an example of an application of a street lamp as an example of a luminaire optical assembly 600 that may include the COB LED 110 and complex optic 100. The luminaire optical assembly 600 may include a lamp pole 610 and a head 620 attached to the pole 610. The head 620 may include a lamp, which may include a light source. The light source may be the COB LED 110. The lamp may include the complex optic 100 configured to emit light from the COB LED 110 in a directed beam 630 to provide an illumination and intensity pattern 635. Outside the pattern 635 the intensity falls off to a lower level.

In another aspect, among the characteristics that may be taken into account include the height 615 of the lamp pole 610, and the illumination pattern/intensity 635 sought for the application, which is determined at least by the combination of the COB LED 110, the index of refraction n and the details of curvature of the inner and outer surfaces 160, 130 of the complex lens 100.

In one aspect of a street light, the collimated light beam may emulate a point source of light, which enables a light distribution pattern (e.g., Type I, II, III, IV, or V, and may also be characterized by BUG description) to be determined by the design of the complex lens 100 positioned below the COB LED 110 (e.g., planar LED array or other light source).

The street lamp of FIG. 6 is merely example of one example, and is not to be construed as so limited, as the components may be arranged to form, for example, a free standing lamp or table lamp including the COB LED 110 and complex lens 100 to provide a light illumination pattern 635 of a similar nature as described above.

Figure 7:
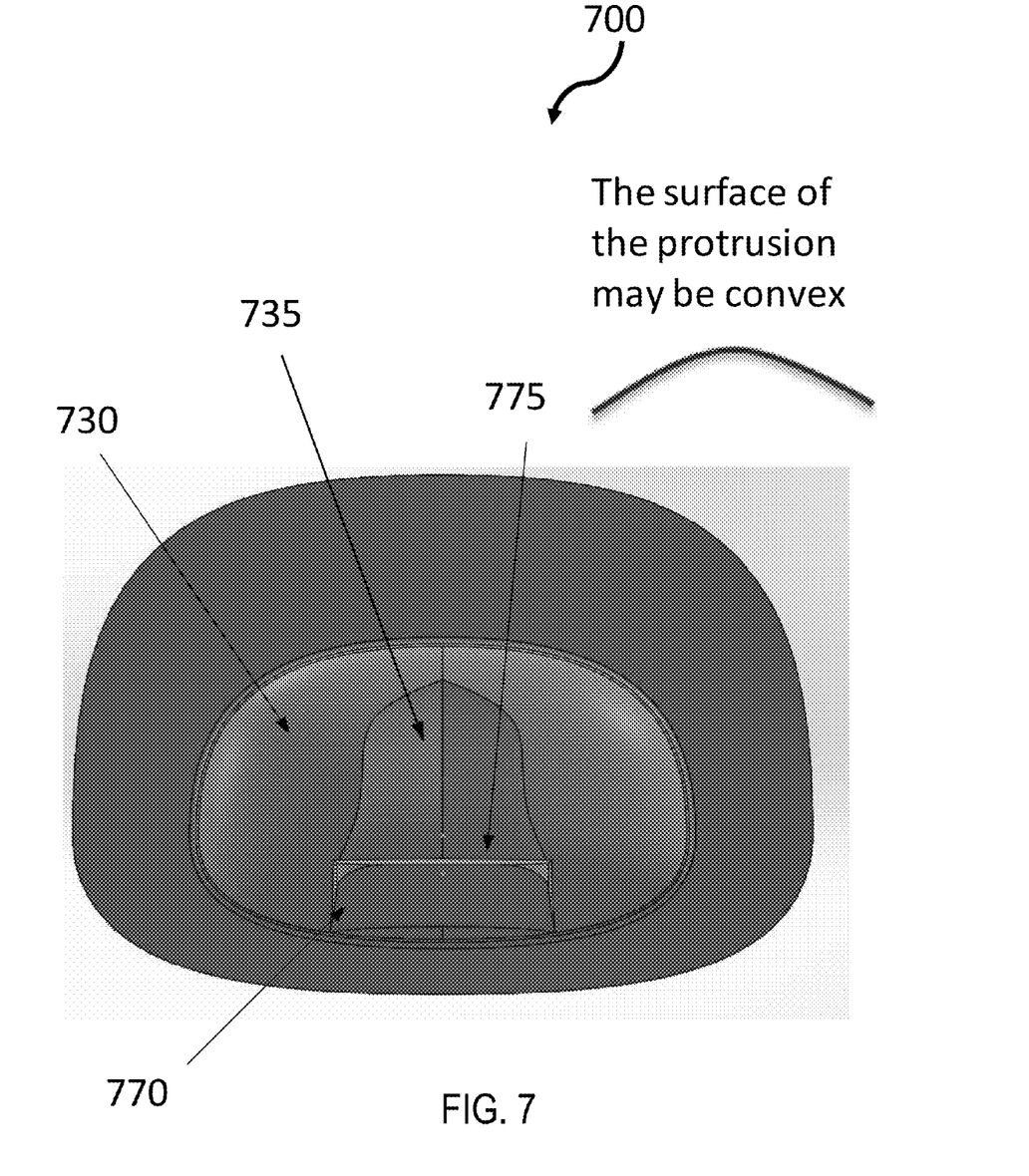
FIG. 7 is a plan view illustrating a COB LED arranged within a complex lens in accordance with the disclosure.

FIG. 7 shows a plan view of additional example aspects of a complex lens 700. The lens may be used with with an extended planar light source similar to lens 100 in FIG. 1, which may be, for example, a COB LED. The lens may comprise similar aspects to the lens described in detail in FIG. 1, including a generally rounded outer surface having a somewhat convex shape. However, as shown in FIG. 7, the indented portion 735 in the outer portion 730 of complex lens 700 comprises a different shape than that shown in FIG. 1. The indented portion 735 may preferably be located directly over the COB LED on a surface opposite the surface facing the COB LED, however, other placements of the indented portion 735 may be considered within the scope of the disclosure. The indented portion may be configured to reduce the light intensity in the beam center and spread it outwards, e.g., to provide a reduction in emitted light intensity in a central zone of the beam pattern emitted from the lens. The indented portion 735 provides a surface that may enable sufficient refraction and/or internal reflection of light away from the normal direction in order to maintain the emitted light intensity within a desired range.

Additionally, a protrusion 770 extends from the outer surface of the complex lens 700 substantially in a light emission direction. The protrusion is shaped to redirect light emitted from the light source. The protrusion controls light spreading of light emitted, e.g., from the COB LED and can be arranged to direct light in a desired direction. For example, the surface 775 of the protrusion extending perpendicular to the rounded outer surface of the cover may be substantially flat as illustrated in FIG. 7. In another example, this surface may be convex in order to provide a spreading of the beam, e.g., along the road.

Figure 8:
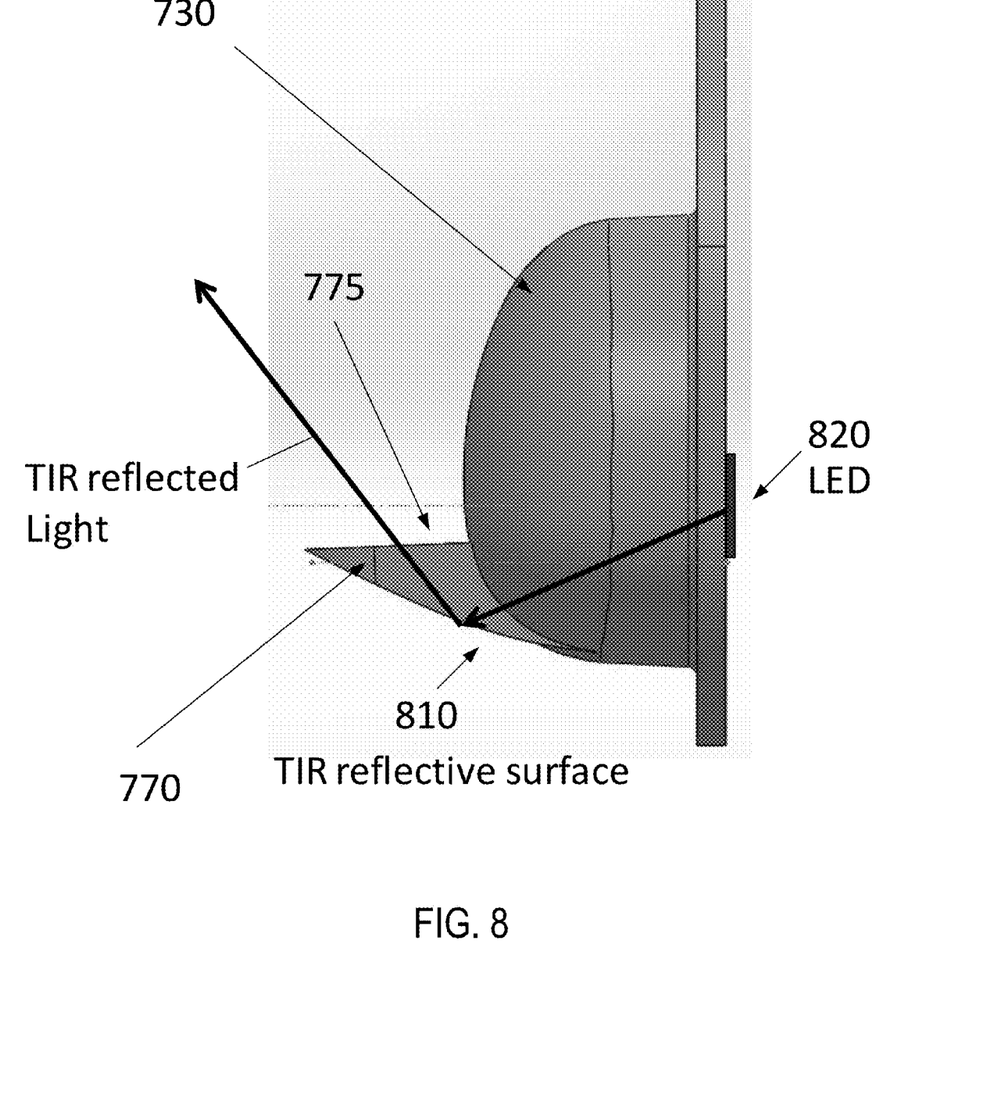
FIG. 8 is a side view illustrating the COB LED arranged within the complex lens of FIG. 7 in accordance with the disclosure.

FIG. 8 illustrates a side view of the complex lens 700 from FIG. 7. As shown in FIG. 8, the protrusion may comprise a wedge shape, e.g., a cross section of the wedge may be substantially wedge shaped. The protrusion may comprise the same material as the rest of the lens. The shape and size of the protrusion may be selected depending on the desired direction or management of the light to be achieved. Thus, the protrusion may be shaped and sized in order to direct the light in a predetermined direction. The protrusion may comprise a reflective surface, such as a total internal reflection (TIR) surface 810. Thus, light emitted from a source, such as an LED 820, may be reflected at a surface of the protrusion and directed toward a desired direction.

Figure 9:
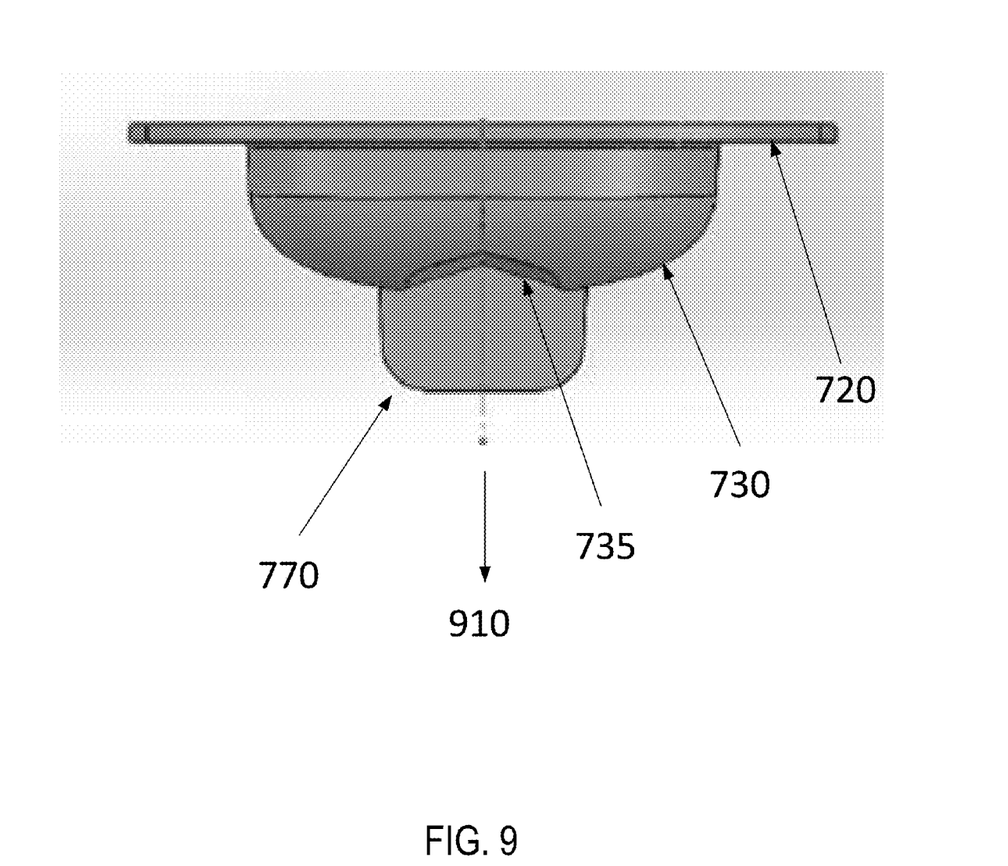
FIG. 9 is a side-view illustrating a long dimension of the complex lens arranged with the COB LED of FIG. 8 in accordance with the disclosure.

FIG. 9 illustrates a side view of the complex lens 700 of FIG. 7 from a side opposite the protrusion 770. Complex lens 700 may include a flange 720. Light is generally emitted from the LED in a light emission direction 910. In FIG. 9, the indented portion 735 has a symmetrical shape, e.g., in a cross section taken parallel to the direction that the protrusion extends across the lens, and an asymmetrical shape when viewed in a cross section perpendicular to the protrusion. Thus, the surface of the indented portion 735 may comprise a symmetrical shape in a first cross section and an asymmetrical shape in a second cross section, e.g., the second cross section being perpendicular to the first cross section.

Figure 10:
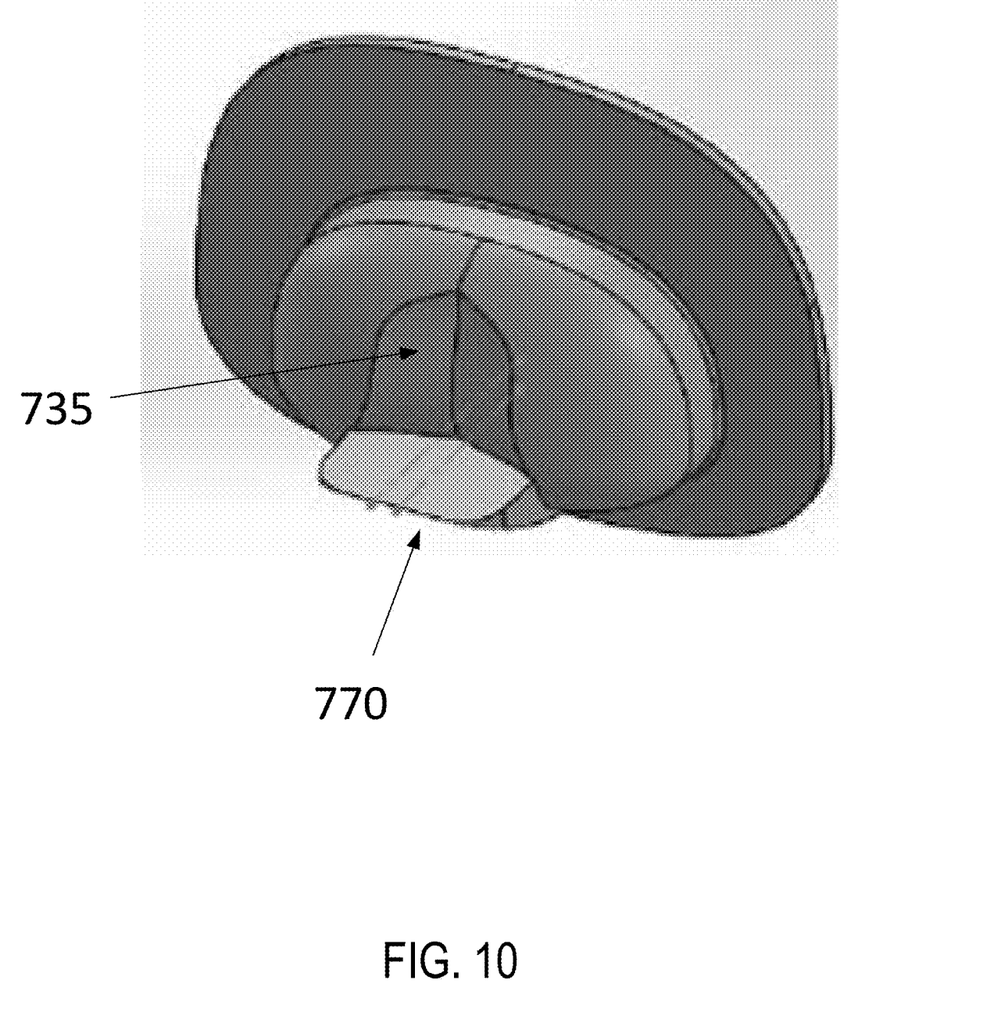
FIG. 10 is a side-view illustrating a long dimension of the complex lens arranged with the COB LED of FIG. 8 in accordance with the disclosure.

FIG. 10 illustrates a perspective view of the complex lens 700 from FIG. 7. As illustrated in FIG. 10, the indented portion 735 may extend substantially across a width of the outer surface of the cover. For example, the indented portion 735 may extend from a first side of the cover adjacent the protrusion 770 to a second side of the cover. Aspects of the complex lens illustrated in FIGS. 7-10 may be used in combination with any of the additional aspects and features described in connection with FIGS. 1-6.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. A lamp, comprising:
   a light source configured to emit light;
   a cover arranged with the light source, an outer surface of the cover opposite the light source comprising:
      a rounded shape;
      a protrusion extending from the cover substantially in a light emission direction, the protrusion having a first protrusion surface extending perpendicular to the outer surface and wherein the first protrusion surface is substantially flat, the protrusion being shaped to direct light emitted from the light source; and
      an indented portion formed adjacent to the protrusion, wherein all of the light emitted from the light source is emitted through the covers, and
   wherein at least a portion of the light is emitted through the indented portion.

2. The lamp of claim 1, wherein the protrusion comprises a wedge shape.

3. The lamp of claim 2, wherein the protrusion comprises a total internal reflection surface.

4. The lamp of claim 3, further comprising:
   a second protrusion surface extending in a direction substantially perpendicular to the rounded outer surface of the cover, the second protrusion surface comprising a convex shape.

5. The lamp of claim 1, wherein the indented portion is formed over the light source, and
   wherein the surface of the indented portion has a symmetrical shape in a first cross section and an asymmetrical shape in a second cross section.

6. The lamp of claim 1, wherein the indented portion extends from the protrusion across a portion of an upper surface of the cover.

7. The lamp of claim 1, wherein the light source comprises a chip on board (COB) light emitting diode (LED).

8. An optical element for covering a light source, the optical element comprising:
   an outer surface comprising a rounded shape;
   a protrusion extending from the outer surface substantially in a light emission direction, the protrusion having a first protrusion surface extending perpendicular to the outer surface and wherein the first protrusion surface is substantially flat, the protrusion being shaped to direct light emitted from the light source through the protrusion; and
   an indented portion formed adjacent to the protrusion, wherein at least a portion of the light is emitted through the indented portion.

9. The optical element of claim 8, wherein the protrusion comprises a wedge shape.

10. The optical element of claim 9, wherein the protrusion comprises a total internal reflection surface.

11. The optical element of claim 10, further comprising:
    a second protrusion surface extending in a direction substantially perpendicular to the rounded outer surface of the cover, the second protrusion surface comprising a convex shape.

12. The optical element of claim 8, wherein the cover comprises an indented portion is formed over the light source, and wherein the surface of the indented portion has a symmetrical shape in a first cross section and an asymmetrical shape in a second cross section.

13. The optical element of claim 8, wherein the indented portion extends from the protrusion across a portion of an upper surface of the cover.

14. A luminaire optical assembly emitting light in a directed beam pattern comprising:
    a pole;
    a head attached to the pole, the head comprising:
       a light source configured to emit light; and
       a cover arranged over the light source, an outer surface of the cover opposite the light source comprising a rounded shape and a protrusion extending from the cover substantially in a light emission direction, the protrusion having a first protrusion surface extending perpendicular to the outer surface and wherein the first protrusion surface is substantially flat, the protrusion being shaped to direct light emitted from the light source; and
       an indented portion formed adjacent to the protrusion, wherein all of the light emitted from the light source is emitted through the cover, and wherein at least a portion of the light is emitted through the indented portion.

15. The luminaire optical assembly of claim 14, wherein the protrusion comprises a wedge shape.

16. The luminaire optical assembly of claim 15, wherein the protrusion comprises a total internal reflection surface.

17. The luminaire optical assembly of claim 16, wherein the protrusion further comprises:
    a second protrusion surface extending in a direction substantially perpendicular to the rounded outer surface of the cover, the second protrusion surface comprising a convex shape.

18. The luminaire optical assembly of claim 14, wherein the cover comprises an indented portion is formed over the light source, and wherein the surface of the indented portion has a symmetrical shape in a first cross section and an asymmetrical shape in a second cross section.

19. The luminaire optical assembly of claim 14, wherein the indented portion extends from the protrusion across a portion of an upper surface of the cover.

20. The luminaire optical assembly of claim 14, wherein the light source comprises a chip on board (COB) light emitting diode (LED).

* * * * *